United States Patent [19]

Roskewitsch et al.

[11] Patent Number: 5,332,979
[45] Date of Patent: Jul. 26, 1994

[54] COMPACT RADIO-FREQUENCY POWER-GENERATOR SYSTEM

[76] Inventors: Janusz Roskewitsch, Evlenweg 13, 6551 Wallertheim/Bundesrepublik; Matthias Hüttl, Wilhelm Leuschner Str. 39, 6087 Büttelborn 2/Bundesrepublik, both of Fed. Rep. of Germany

[21] Appl. No.: 759,229

[22] Filed: Sep. 13, 1991

[30] Foreign Application Priority Data

Feb. 11, 1991 [DE] Fed. Rep. of Germany ....... 4104064

[51] Int. Cl.$^5$ .......................... H03B 5/36; H05K 5/04
[52] U.S. Cl. ........................ 331/68; 331/62; 331/64; 331/67; 331/69; 331/116 R; 331/158; 361/690; 361/697; 361/730
[58] Field of Search ................. 331/62, 64, 67, 68, 331/69, 116 R, 116 FE, 158; 361/381, 383, 384, 386, 388, 389, 393, 394, 399, 690, 697, 730

[56] References Cited

U.S. PATENT DOCUMENTS

4,583,056 4/1986 Takeda et al. ................ 331/68 X
4,794,509 12/1988 Nussbaumer .................. 361/384 X Primary Examiner—Siegfried H. Grimm
Attorney, Agent, or Firm—Ostrolenk, Faber, Gerb & Soffen

[57] ABSTRACT

An RF power-generator system for the frequency range of 2 to 30 MHz and a programmable sinusoidal power output of 0 to 1000 W. The system is constructed of modules (10, 30, 50, 70 and 90) accommodated in a shallow parallelepipedal housing (1) with a capacity of 4.6 l. The housing essentially comprises two lateral lengths (4) of structural section, a sheet-metal front (6), a sheet-metal bottom (5), and a lid. A crystal-controlled power-oscillator module (10) communicates by way of an RF line (121) with an intermediate module (30). The intermediate-amplifier module communicates by way of still another RF line (122) with a terminal power-amplifier module (50). The terminal power-amplifier module communicates by way of still another RF line (123) with a high-power filter (70). The filter communicates by way of still another RF line (124) with a high-power directional coupler (90). The RF power output can be intercepted at an RF plug (2). A flat fan (120) generates a current of air to cool the power modules (30, 50, 70 and 90). Modules (10, 30, 50 and 90) with built-in electronics all have an integrated control-and-diagnostics unit that communicates by way of multiple cable (125, 126, 127 and 128) with a processor (110). Results are displayed on a display (111). Controls (112) make it possible to employ prescribed operating modes.

42 Claims, 8 Drawing Sheets

COMPACT RADIO-FREQUENCY POWER-GENERATOR SYSTEM

The invention concerns the field of radio-frequency (RF) power generators. Radio frequencies range from approximately 2 to 30 MHz. Such generators typically emit 1 kW of power at a load resistance of 50 Ω. They are used in cathode-sputtering, gas-plasma, and medical equipment, for telecommunications, etc.

Conventional RF generators for these ranges of output and frequency are very bulky (IEEE Transactions on Broadcasting, BC-26, 14 [Dec. 1980], pp. 99–112 and FIG. 18). Their need for much space can be ascribed to several factors. First, their augmenting components, transistors for example, operate at high frequencies and with relatively high losses, and the resulting heat must be dissipated by large sinks. To ensure high quality, most of their magnetic components, especially their RF coils and transformers, must have air cores, which makes them as well very large. To eliminate electromagnetic interference, all components must be accommodated in a shielded housing. To avoid negative effects on the parameters of the magnetic components in particular, however, the housing must be considerably remote from these already large structures. These and other common design principles accordingly make generators of this type fairly huge.

One object of the present invention is accordingly an RF power-generator system with a very compact and preferably extremely flat structure that can in particular be inserted into a circuit-board cabinet. A wide range of novel design principles had to be developed for this purpose.

Another object of the invention is to reduce the overall dimensions of each individual electronic functioning unit in the generator system to a minimum, which is equivalent to increasing the power density in terms of RF power per volume to a maximum, without sacrificing efficiency, reliability, life (mean time before failure), range of application, etc. Some new circuitry principles had accordingly to be developed, combined with known circuitry principles, and finally appropriately incorporated.

Still another object of the invention is to ensure unexceptionable operation on the part of the electronic-circuit components by means of integrated surveillance circuits that will respond rapidly enough to reliably prevent damage to the electronic components, especially the transistors, as the result of excess heat or surges.

Still another object of the present invention is to equip the electronic-circuit units such that they can be controlled from outside by means of input-control signals. To control signifies for example establishing a desired RF-output power, modulating the RF-output power, engaging and disengaging the RF-output power, etc.

Still another object of the invention is to provide a processor that will couple the user's external control signals to the output signals from the individual electronic units, display the state of the generator system, and simultaneously generate the control signals needed to affect the electronic units of the RF-generator system as desired.

Still another object of the present invention is to ensure that the control-and-surveillance circuits built into each electronic unit will not be disrupted by RF power that is $10^3$ to $10^7$ higher.

The final object of the invention is to minimize the unavoidable effects of ambient conditions, especially temperature, on the generator and especially on its output power by means of appropriate regulating circuits without allowing the generator system to overload and even fail.

The means of attaining the aforesaid objects in accordance with the invention will be most easily described and comprehended with reference to the embodiments illustrated by way of example in the drawings, wherein.

Figure 1:
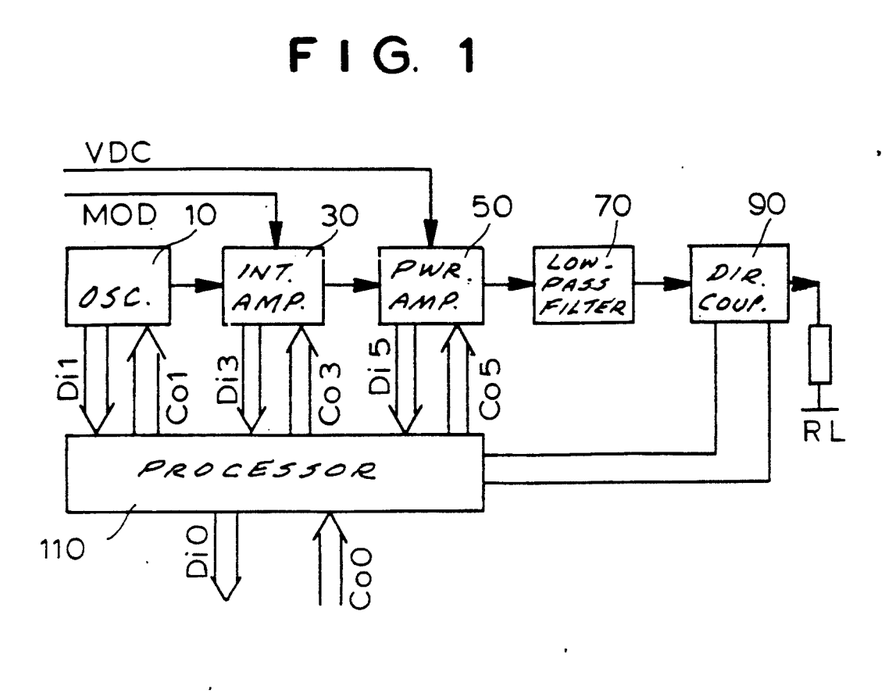
FIG. 1 is an overall block diagram of an RF power-generator system.

FIG. 1 illustrates an RF-power generator with all the components it needs for smooth operation. It consists essentially of six elements- a power-oscillator module 10, an intermediate-amplifier module 30, a terminal power-amplifier module 50, a high-power low-pass filter 70, a high-power directional coupler 90, and a processor 110. The output terminal terminates in a load resistor RL.

Processor 110 emits diagnostics signals Di0 to the user, who controls it in turn by way of signals Co0.

The first three modules 10, 30, and 50 are electronic and have integrated control-and-diagnostics units. Diagnostics signals Di1, Di3, and Di5 provide information as to the modules' states and control signals Co1, Co3, and Co5 allow purposeful intervention into their operations.

The generator system is completed by connections for a modulation signal MOD and for a particularly powerful direct-current operating voltage VDC.

Figure 2:
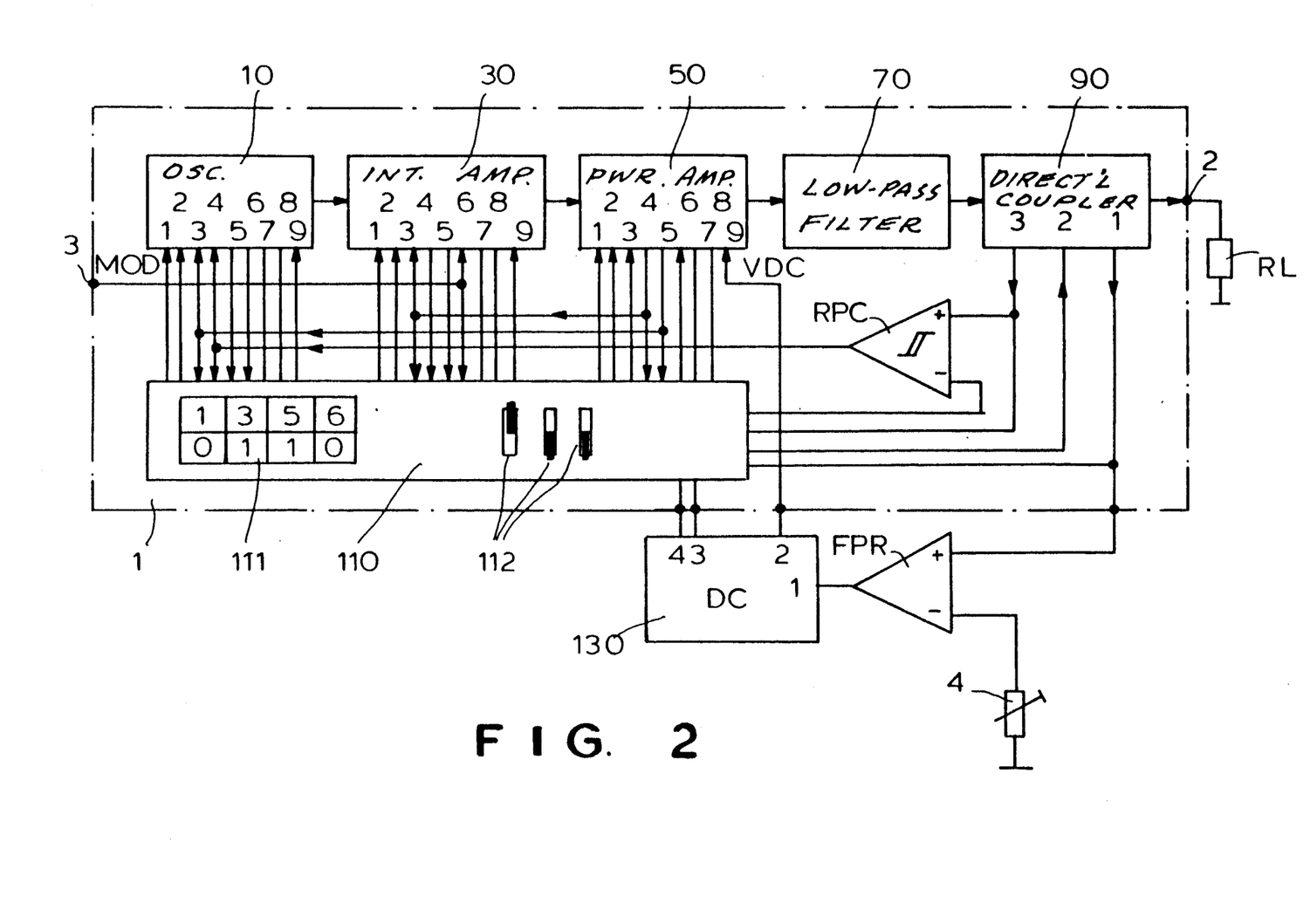
FIG. 2 is a block diagram of an RF power-generator system with the external direct-current supply component needed to operate it and with some regulating and surveillance circuits.

FIG. 2 illustrates one concrete embodiment of the RF power-generator system illustrated in FIG. 1. Generator system 1 is represented by a dot-and-dash line. The system is completed by external components.

Each electronics module 10, 30, and 50 has nine connections. The modules inform processor 110 as to both their current state and any malfunctions by way of some of these connections. The processor indicates the states on a display 111. The user can also enter particular parameters by way of controls 112 to be added to the other signals in processor 110 in order to construct signals for controlling the operation of electronics modules 10, 30, and 50.

FIG. 2 also shows a source 130 of external direct current for operating generator 1. Source 130 forwards direct-current voltage of a constant level to its output terminals 130.3 and 130.4 for operating both the processing circuits and the weaker RF modules 10 and 30. The variable-level direct-current operating voltage VDC is present at output terminal 130.2 whence it is forwarded directly to power-amplifier module 50. For this purpose a forward-power regulator FPR compares the signal at the output terminal 90.1 of directional coupler 90 associated with RF-output power amplifier FPR with a reference potential connected to a potentiometer 4 and forwards the resulting difference signal in the capacity of a control parameter to the input terminal 130.1 of direct-current source 130.

Power supplies that emit variable-level voltages, and regulating circuits for operating them, are commercially available. To ensure that the efficiency of the generator as a whole will remain as high as possible and to accordingly ensure that operating losses will remain as low as possible, it is recommended to design direct-current source 130 with an automatic cutoff.

FIG. 2 also illustrates a surveillance-and-sentry circuit: in the form of a reverse-power comparator RPC represented by a Schmitt trigger. An input terminal RPC+ is connected to the reverse-power test-output terminal 90.3 of directional coupler 90. When the switching threshold of the trigger is exceeded, a barrier signal arrives at the DISABLE-input terminal 10.4 of power-oscillator module 10 and disengages it. Generator 1 will accordingly turn off when a significant mismatch, due to a short circuit or line discontinuity for example, is detected at output terminal 2.

Finally, the external rectangular modulation signal MOD can be introduced at the generator's input terminal 3. Signal MOD will thence arrive at the modulation input terminal 30.6 of intermediate-amplifier module 30 to control the module's programmable amplification factor.

Another control signal can be employed to transform the RF output voltage from quasi-sinusoidal, with filter, to quasi-rectangular, without filter, and back.

Figure 3:
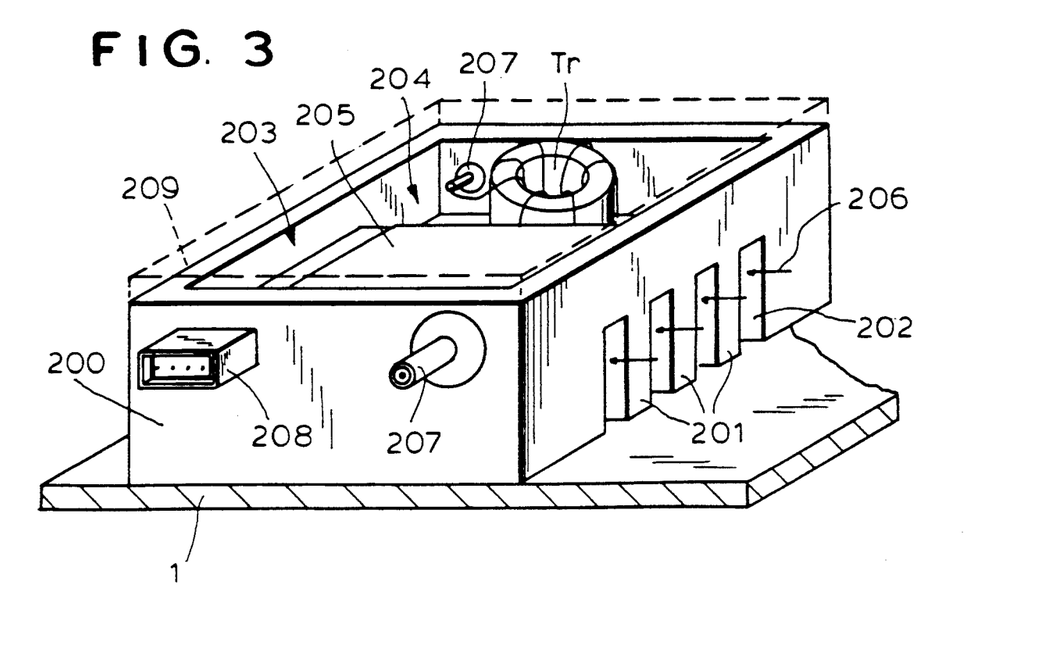
FIG. 3 is a schematic representation of an electronics module.

FIG. 3 is a perspective view of the basic structure of electronics modules 10, 30, and 50. An essential element is a parallelepipedal heat sink 200 with heat-dissipation fins 201 on the bottom. Positioning the fins directly against the base of generator housing 1 as illustrated will create channels 202 for a current 206 of cooling air.

Apparent in the top of heat sink 200 is a space 203 and 204 for accommodating such electronic components as an SMD, thick-film, thin-film, and/or hybrid circuit on a ceramic tile 205 that in a known technology has printed circuits and components on it along with such other individual components as an annular-core transformer Tr. Space 203 and 204 is sealed high-frequency tight at the top by a lid 209.

To optimize the dissipation of any heat that occurs in the components mounted on tile 205 or in the annular core of transformer Tr, the contact with heat sink 200 and/or lid 206 must be perfect. The height of space 203 and 204 is accordingly adapted to the dimensions of the individual components, allowing for one or more levels if necessary. The section 203 of space in the vicinity of tile 205 will accordingly not be as deep as the section 204 in the vicinity of transformer Tr.

Both the outgoing diagnostics signals and the control signals are present at a plug-in 208. The RF signals are present at RF plug-in connections 207.

As will be evident from FIG. 3, there is no special shielding inside space 203 and 204 between the RF-amplifying circuit components and the components that survey and control their function. Problems with electromagnetic interference can be eliminated by combining the illustrated mechanics with appropriate amplification circuits of the type that will now be described with reference to FIGS. 8 and 13.

Figure 4:
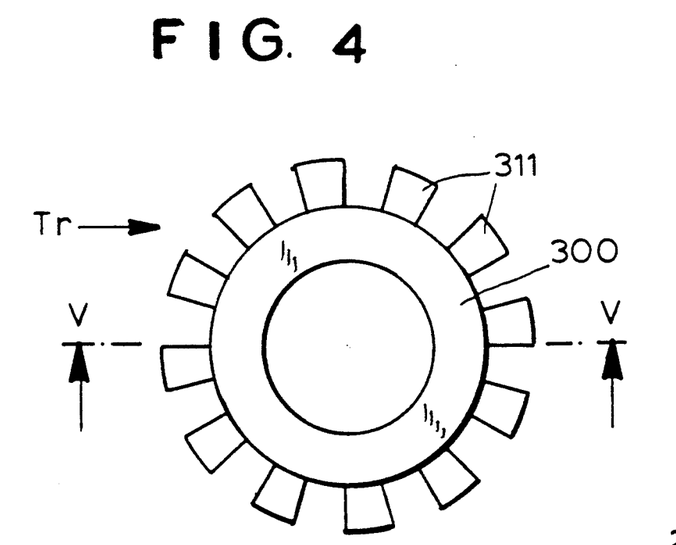
FIG. 4 is a top view of the core of an annular magnet with a heat sink.

All the components in such a compact structure as the instant RF-power generator are highly stressed. This is also true of such magnetic components as the annular-core output transformer Tr illustrated in FIG. 3. FIG. 4 illustrates how the unavoidable heat losses that occur in annular core 300 can be optimally dissipated. Core 300 is accommodated in a pot-shaped heat sink 310 with heat-dissipation ribs 311 that rest against its outer surface. Enough space to coil a wire is left between the ribs.

Figure 5:
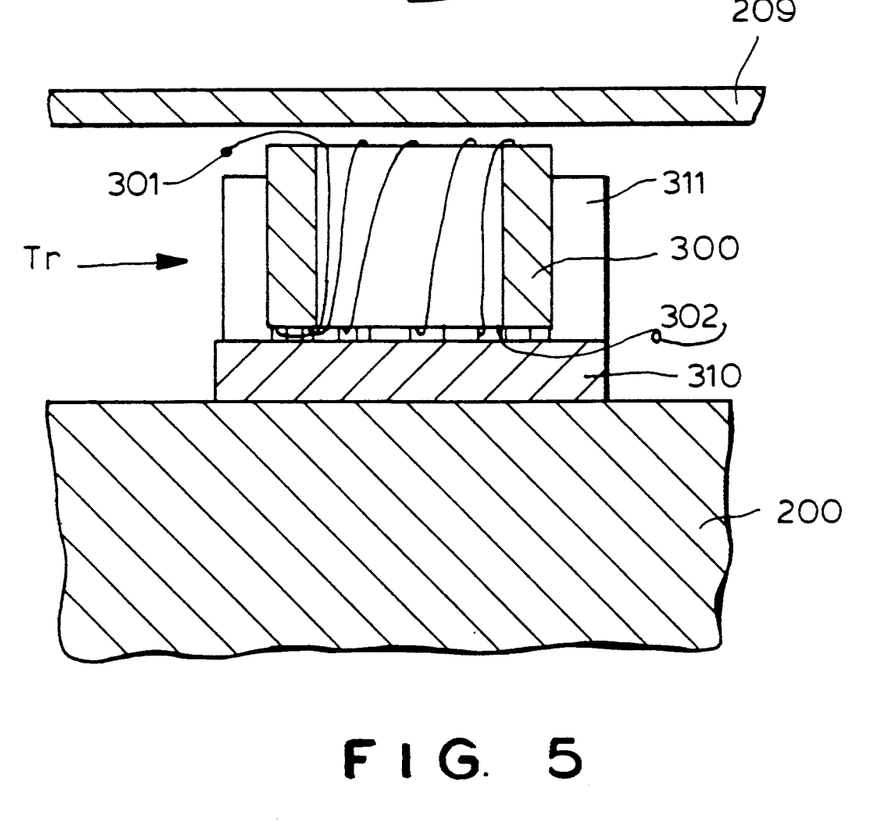
FIG. 5 is a section through an electronics module in the vicinity of the core of an annular magnet with a heat sink.

FIG. 5 is a longitudinal section through the vicinity of the annular-core transformer Tr in the module illustrated in FIG. 3. It will be evident how core 300 is accommodated in the pot-shaped heat sink 310 with its heat-dissipation ribs 311 between heat sink 200 and lid 209 in deeper section 204. Transformer windings 301 and 302 are illustrated schematically. Since the area of contact between heat-dissipation pot 310 and heat sink 200 is extensive, any excess heat that occurs in core 300 can be very rapidly dissipated over the shortest possible route.

Figure 6:
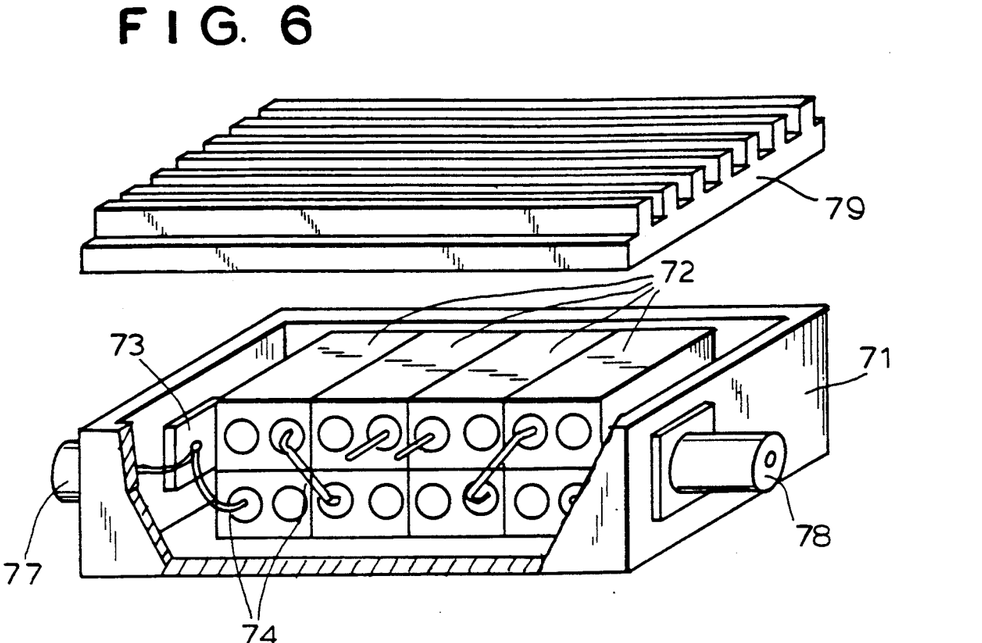
FIG. 6 is a partly broken perspective view of a compact RF low-pass filter for high outputs.

FIG. 6 is a partly broken perspective view inside a high-power low-pass filter 70, which has an RF-power density of approximately 3 kW/l. This component is a Chebishev filter of the fifth order. The coils have two-aperture magnetic cores 72. Since the area of contact between the coils and housing 71 and lid 79 is extensive, the unavoidable excess heat will be optimally dissipated into the environment.

Power-chip capacitors 73 are mounted flat and directly to housing 71, which functions as a mass. RF jacks 77 and 78 constitute the filter's input and output terminals.

The magnetic coupling between the coils can be varied by varying the interval between the faces of magnet cores 72 and housing 71. This approach makes it possible to purposefully dimension even filter curves of a higher order with several curves and zero points.

It is only the illustrated compact structure with its shallow component-accommodation space that makes it possible to prevent parasitic RF energy from input jack 77 from arriving unfiltered at output jack 78 even at RF outputs of 1000 W and higher. The amplitude of the second and third harmonic is 50 to 60 dB below the basic-frequency amplitude. No higher harmonics are measurable. A sine signal will accordingly occur at output jack 78. Losses at the filter's throughput-frequency range are only approximately 5%, which are surprisingly low.

Figure 7:
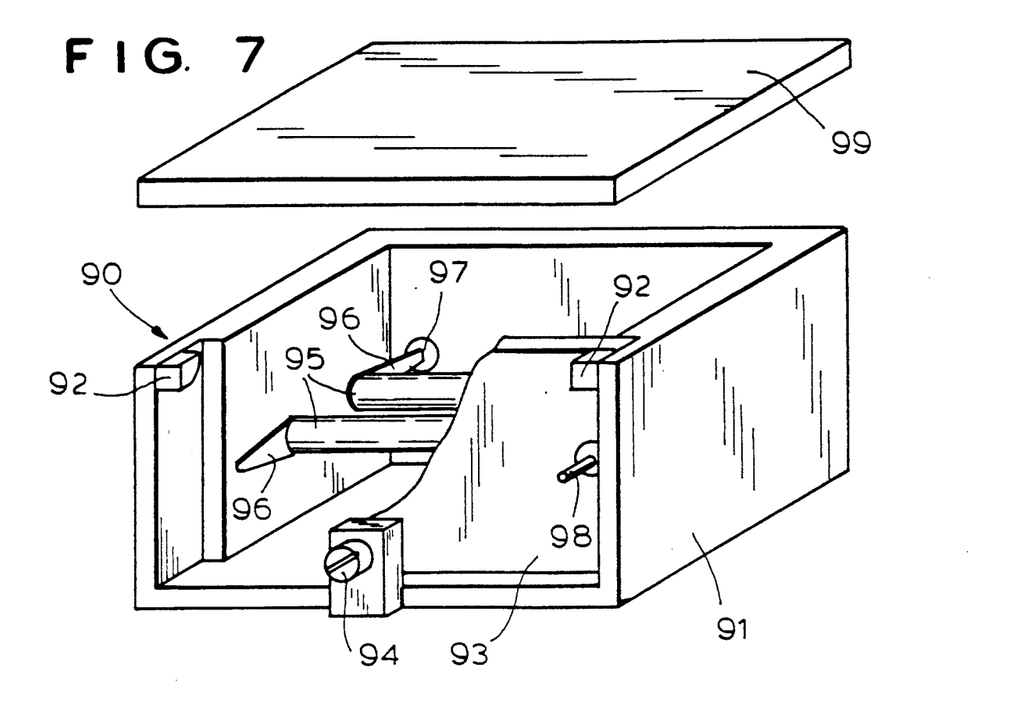
FIG. 7 is a partly broken perspective view of a compact directional coupler for high outputs with only one device for adjusting its orientation.

FIG. 7 is a partly broken perspective view of directional coupler 90. Again apparent is a shallow parallelepipedal housing 91 that is sealed high-frequency tight by a lid 99. The housing's front wall 93, however, is loose and secured at the top by stops 92 and at the bottom by a screw 94. The position of wall 93 can accordingly be finely adjusted.

Evident inside housing 91 are two parallel cylindrical conductors 95. Conductors 95 are secured by sheet-metal intakes 96 positioned at a right angle to them and mounted against the rear wall and against the movable front wall on insulators 97. Outside are connectors 98.

The length and diameter of parallel conductors 95 dictate the coupling factor. Since the instant component is a directional coupler for power outputs of 1000 to 5000 W, the coupling factor can be small.

The shape, size, and position of conductors 95 and intakes 96 ensure a desired wave resistance of 50 Ω. The design in accordance with the invention leaves the wave resistance and coupling factor unaltered when screw 94 is tightened.

The space between parallel conductors 95 dictates the directional situation. Rotating screw 94 will vary the position of wall 93 and accordingly the distance between the conductors while leaving them parallel. This is the difference between the directional coupler 90 in accordance with the invention and commercially available couplers, which require at least two components to adjust the directional situation.

The circuitry of oscillator module 10 will now be described with reference to FIG. 8. The figure shows a crystal Q in series with a tunable LC circuit LCO. Crystal Q is excited by an MOS push-pull circuit in the form of voltage-controlled sources $V, g_m V$, whereby $g_m$ is the transconductance ($\Delta I_{out}/\Delta V_{in}$) and V is the control voltage. Using MOS transistors as a source of current is known from the particular manufacturers' (Texas Instruments Inc.) application notes. The positive feedback needed to initiate oscillation is obtained with an RC-coupling stage RCO, which will be described in greater detail hereinafter with reference to FIGS. 9 through 12.

Sources $V, g_m V$ operate on an output-bandpass filter BF that terminates at the secondary end in a load resistor RLO.

As heretofore mentioned, power-oscillator module 10 is also provided with various surveillance-and-control circuits.

The first to be mentioned is a current-surveillance circuit CS, which will be described in greater detail with reference to FIG. 15. When direct power-supply current IDC exceeds its maximum, a surge-barrier signal is emitted to an ENABLE-DISABLE unit ENDI.

Also worth mentioning is a temperature-surveillance circuit T. This component is essentially a sensor in the form of a bipolar transistor positioned as near as possible to those points in the circuit that are most exposed to heat, usually the transistors. If the detected temperature exceeds a level prescribed by a reference generator RE, an excess-temperature barrier signal is forwarded to ENABLE-DISABLE unit ENDI.

Also involved, finally, is a diagnostics unit D that evaluates the incoming control signals C1, compares them with the state-characterizing signals generated by surveillance circuits T and CS and reference generator RE, and forwards them in the capacity of diagnostics-output signals D1 to processor 110.

Figure 16:
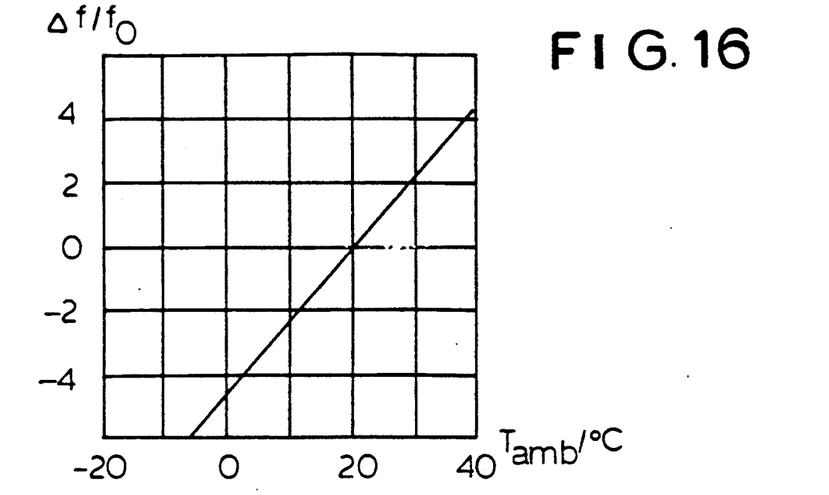
FIG. 16 is a graph of the frequency precision $\Delta f/f_n$ of the RF power-generator system illustrated in FIG. 2 as a function of ambient temperature $T_{amb}$.

The design of the oscillator circuit as an MOS push-pull circuit with positive feedback makes it possible to attain a high power density and frequency stability. The empirical results are illustrated in FIG. 16. It will be evident that the frequency will vary only approximately $\pm 50$ ppm as the ambient temperature $T_{amb}$ varies between 0° and +40° C.

Figure 8:
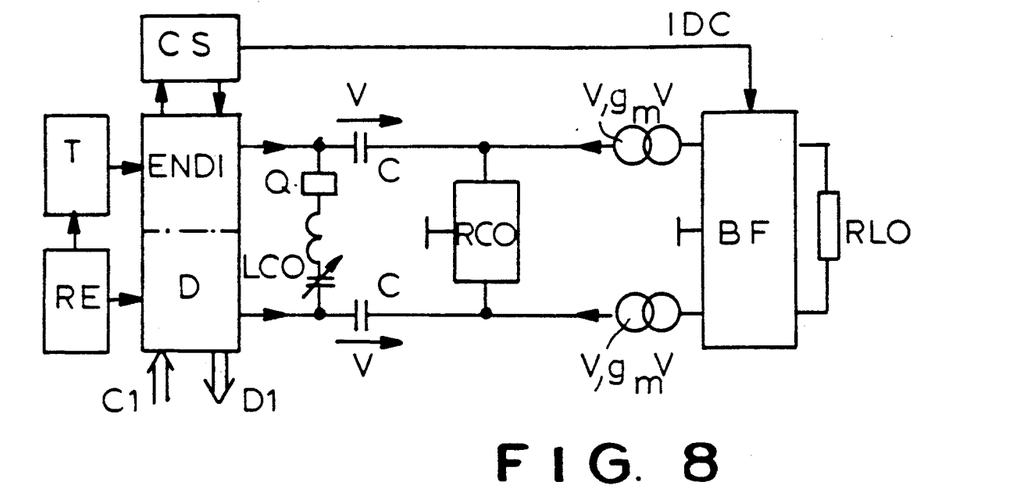
FIG. 8 is a schematic diagram of a crystal-controlled oscillator-output module with additional surveillance and control circuits.
Figure 9:
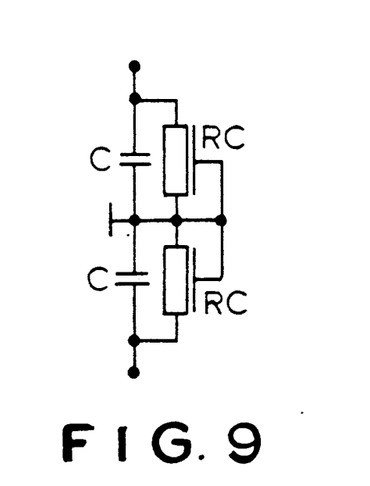
FIGS. 9 through 12 illustrate various embodiments of feedback circuits with distributed resistors and capacitors and appropriate for use in the circuit illustrated in FIG. 8.
Figure 10:
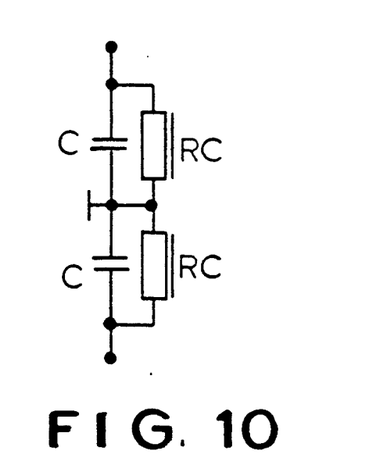
Figure 11:
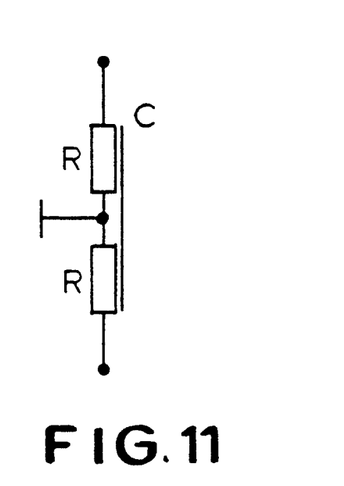
Figure 12:
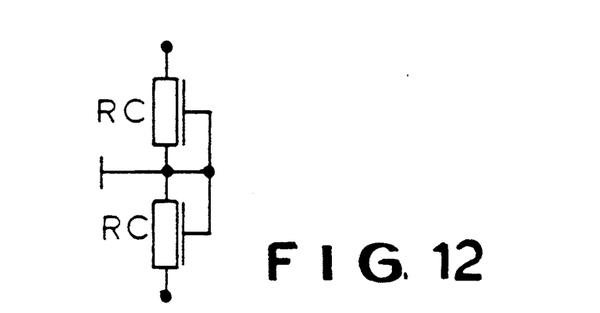

FIGS. 9 through 12 illustrate various embodiments of the RC stage RCO illustrated in FIG. 8. Common to all versions of this circuit is that they involve distributed RC stages RC. This is the only way to not only eliminate the housing and heat-sink capacities that occasion interference in conventional circuit but also to increase frequency stability while saving space.

The design of the amplifier circuits in RF-amplifier modules 30 and 50 will now be described with reference to FIG. 13. This circuit is an MOS push-pull amplification circuit with MOS transistors T1 and T2 acting on a broad-band transformer BT that terminates at the secondary end in a load resistor RL1. A circuit comprising several individual transistors can obviously be employed instead of MOS transistors T1 and T2 at higher outputs.

The RF signal that is to be amplified is forwarded to an RF-input circuit RF-IN. This circuit will be described hereinafter with reference to FIG. 14. The signal at connections x—x is forwarded by way of coupling networks RC1 and RC2 and RC3 and RC4, with distributed resistors and capacitors, to the control electrodes of MOS transistors T1 and T2.

Evident upstream of the control electrodes are diodes D1 and D2, which trim the negative wave halves of the RF signals. Although this procedure does to some extent decrease the efficiency of the circuit, it also increases its upper-threshold frequency, which is of essential significance to RF amplifiers. The amplifier circuit itself is a Class D circuit and is extremely efficient.

Figure 13:
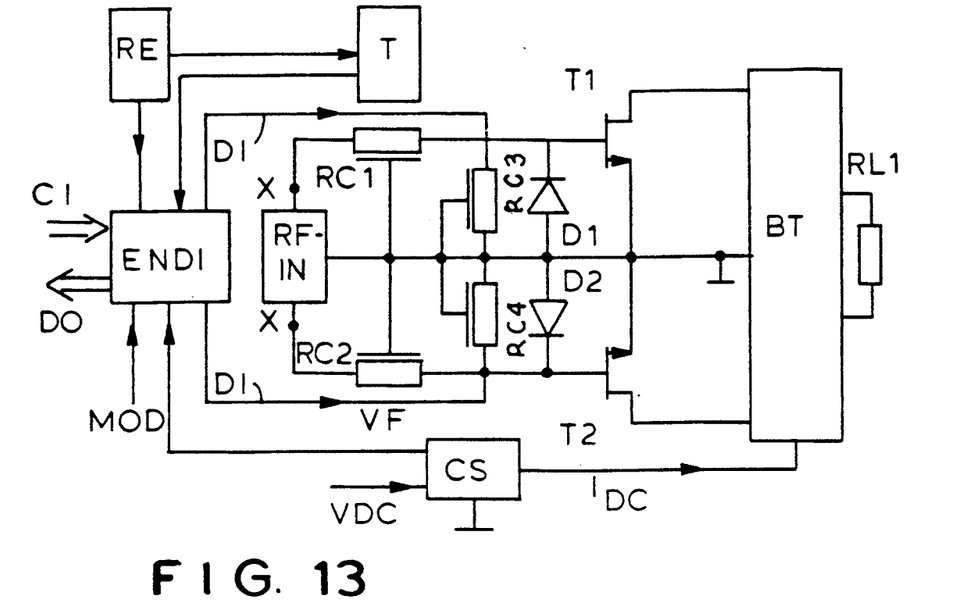
FIG. 13 is a schematic diagram of an RF-amplifier module with additional surveillance and control circuits.

The amplifier circuit illustrated in FIG. 13 is also protected by a temperature-surveillance circuit T and a current-surveillance circuit CS. Also present are a diagnostics unit D and an ENABLE-DISABLE unit ENDI.

If the amplification factor of the RF amplification circuit changes, for the purpose of modulating the RF output signal for example, a modulation signal MOD will be introduced into ENABLE-DISABLE unit ENDI. Logical addition to the DISABLE signal, which is a component of control-input signals CI will affect the potential at MOS transistors T1 and T2 by way of lines DI to the extent that the desired alteration in the amplification factor will occur.

The potential at DISABLE lines DI is also used to very rapidly reduce the amplification factor when temperature-surveillance circuit T or current-surveillance circuit CS become involved and accordingly to prevent overloading the semiconductors.

Figure 14:
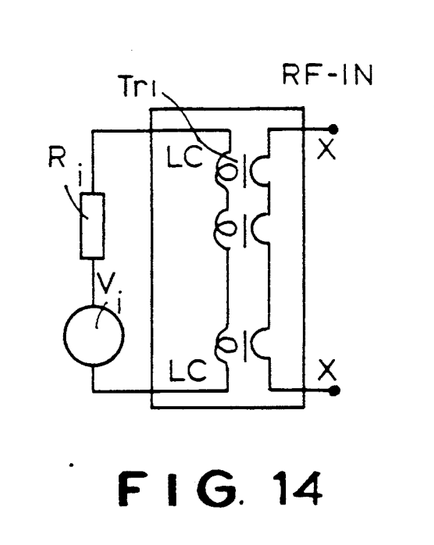
FIG. 14 is an RF-input circuit of the type employed in the amplifier circuit illustrated in FIG. 13.

FIG. 14 illustrates one version of the RF-input circuit RF-IN illustrated in FIG. 13. A source Vi of radio frequency with an interior resistor Ri supplies an input transformer Tri. The transformer's primary winding is a line LC with distributed inductances L and capacitors C. Each secondary winding has only one turn, and the desired transmission ratio is obtained by a series of secondary windings.

Figure 15:
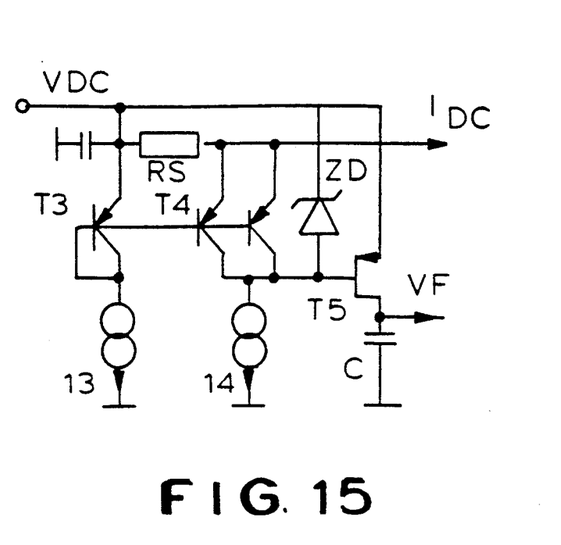
FIG. 15 is a current-surveillance circuit of a type that could be employed in the circuits illustrated in FIGS. 8 and 13.

FIG. 15 illustrates current-surveillance circuit CS. The essential components of this circuit are bipolar transistors T3 and T4, which have steady currents I3 and I4 flowing through them. A direct power-supply current IDC, obtained from operating-voltage source VDC for example, flows through a current-measuring resistor RS. The result is a voltage drop that is measured and amplified and utilized to control an MOS switching transistor T5 such that a surge signal will appear at its output terminal when a threshold is exceeded and will trigger the aforesaid control measures in ENABLE-DISABLE unit ENDI.

Current-surveillance circuit CS functions on the basis of the fact that the emitter surfaces of transistors T3 and T4 differ. The current IS through measuring resistor RS can be calculated from the formula $$IS = 1/RS \cdot kT/q \cdot \ln(I3/I4) \cdot N$$

where
k is the Boltzmann constant,
q is the charge on an electron,
T is the absolute temperature, and
N is the ratio between the emitter surfaces of T3 and T4.

One advantage of the present circuit is its rapidity. Another advantage is its temperature independence. It responds only when currents IS or IDC exceed the level permissible for smooth operation of MOS transistors T1 and T2.

FIG. 16 illustrates the relative-frequency deviation $\Delta f/fn$ of the total generator 1 as a function of ambient temperature $T_{amb}$ at a maximal power output of 1 kW continuous at a load resistance of 50 Ω. It should be remarked that crystal Q was not thermostatized during the test.

Figure 17:
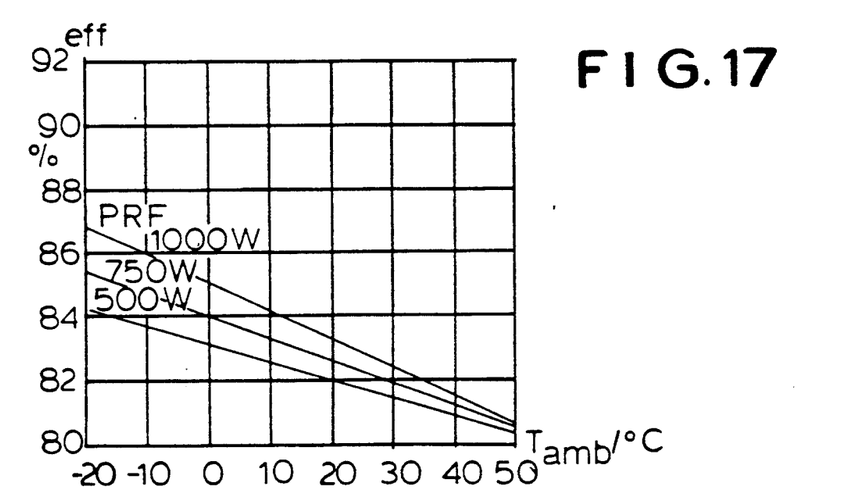
FIG. 17 is a graph of the efficiency eff of the RF power-generator system illustrated in FIG. 2 as a function of ambient temperature $T_{amb}$ at various RF-power outputs PRF.

FIG. 17 illustrates the efficiency eff (PRF/DC-power input) of the circuit illustrated in FIG. 13 as a function of ambient temperature $T_{amb}$ at power outputs PRF of 500, 750, and 1000 W. The efficiency is between 80 and 87%, which is very high. The power dissipation is accordingly very low—13 to 20%. The semiconductors, printed circuits, and heat sinks will accordingly heat up only slightly, resulting on the whole in very economical and smooth operation and in particular in the potential for a very compact and space-saving design.

Figure 18:
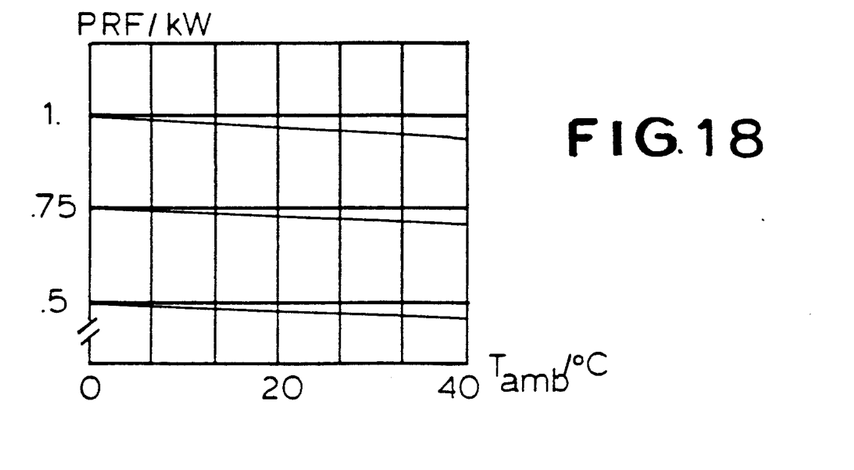
FIG. 18 is a graph of the RF power output PR of the RF power-generator system illustrated in FIG. 2 as a function of ambient temperature $T_{amb}$ but without the power-forwarding regulator illustrated in FIG. 2.

FIG. 18, finally, illustrates the RF power output PRF of the complete generator system 1 as a function of ambient temperature $T_{amb}$ at thermal equilibrium. It will be evident that power output PRF will decrease very little, even at the highest permissible ambient temperature of 40° C. Measurements are obtained at a direct operating current VDC, meaning without the forward-power regulator FPR in FIG. 2. No temperature dependence at all can be measured when a forward-power regulator FPR is employed.

The use of a combination of appropriate RF circuits, especially MOS push-pull circuits, in all modules, of optimized principles of actualization, especially hybrid thick-and-thin film circuits with integrated resistors, and of SMD, as well as of optimized dimensioning-and-design strategies makes it possible to create an RF-generator system that will generate a sinusoidal RF power output of 0 to 1000 W in a frequency range of 2 to 30 MHz within a volume of only 4.6 l. The RF-power density, including that of the fan, processor, display, metal housing, etc., is 220 W/l. The modular technology and the potential for controlling each module with external signals makes it possible to respond very flexibly to customer needs. The built-in current-and-temperature surveillance circuits allow reliable and smooth operation even at maximum power. The diagnostics unit built into each module and the processor that handles all of them provide the user at all times with a complete overview of the generator's inner state, so that maintenance and repair can always be carried out prior to the occurrence of any defect.

Figure 19:
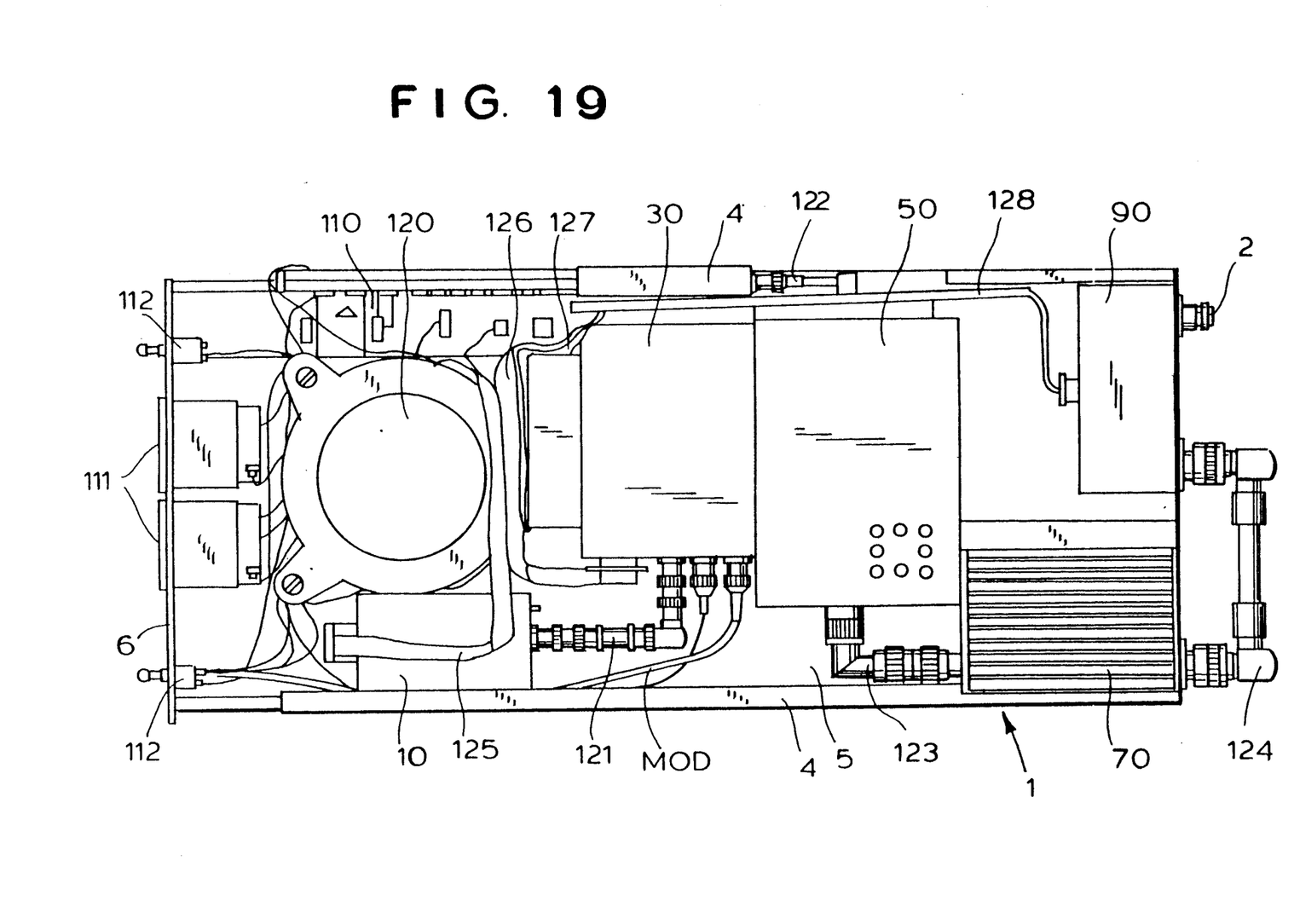
FIG. 19 is a top view of a ready-to-operate RF power-generator system assembled from modules and installed in a housing.

FIG. 19, finally, is a view of a ready-to-operate RF power-generator system with a 1000 W sinusoidal power output. It comprises modules 10, 30, 50, 70, and 90 and is built into a shallow parallelepipedal housing 1 with a capacity of 4.6 l. The lid has been removed to expose the interior.

Housing 1 consists essentially of two sides 4 made of lengths of structural section, a sheet-metal front, and an (unillustrated) lid. Power-oscillator module 10 is at the bottom of the drawing. Its RF-output signal is forwarded by way of an RF line 121 to intermediate amplifier 30, from there by way of RF line 122 to terminal power-amplifier module 50, and hence by way of another RF line 123 to a high-power filter 70 and by way of still another RF line 124 to high-power directional coupler 90. A high-power sinusoidal RF output signal PRF occurs at output terminal 2.

Multiple cables 125, 126, 127, and 128 extend from processor 110, at the left of the drawing, to modules 10, 30, 50, and 90 and convey diagnostics signals Di1, Di3, Di5, control signals Co1, Co3, and Co5, and directional-coupler test signals.

Housing 1 also contains an efficient fan 120 to generate a flow of air to cool electronics modules 30 and 50, a high-power low-pass filter 70, and high-power directional coupler 90.

As will be evident from FIG. 19, the inside of housing 1 has, in spite of its high power density of 220 W/l, enough unoccupied space to allow the installation of even more high-power components.

We claim:

1. An RF power-generator system, comprising:
a shielded housing;
a plurality of electronic units in the form of modules disposed in the housing, the electronic units including an oscillator and power amplifier means coupled to the oscillator,
a plurality of other units in the form of modules disposed in the housing, the other units including an output filter coupled to the amplifier means, a directional coupler coupled to the output filter and a processor for providing input signals to the electronic units to control the same; and
each electronic unit including a parallelepipedal heat sink with a recessed accommodation space, a tile within the accommodation space and a lid for sealing RF-tight, the accommodation space, the tile having a plurality of electronic components and printed circuits comprising the electronic unit disposed thereon in optimal contact with the heat sink.

2. Generator system as in claim 1, wherein each heat sink has heat-dissipation fins and a channel for a current of cooling air.

3. Generator system as in claim 2, wherein the heat sinks in at least two modules are aligned to create a joint cooling channel.

4. Generator system as in claim 3, wherein the current of cooling air also cools the modules in the output filter and the directional coupler.

5. Generator system as in claim 1, wherein a magnet core is installed in the space between each heat sink and the lid.

6. Generator system as in claim 1, including magnet cores that are highly stressed magnetically or thermally which are accommodated in a cooling pot with adjacent heat-dissipation ribs.

7. Generator system as in claim 1, wherein the accommodation space is as shallow as possible in relation to the tile.

8. A generator system as in claim 7, wherein choke coils and transformers are included in the accommodation space, the height of the space in the vicinity of the components accommodated therein varying in accordance with the height of such components.

9. Generator system as in claim 1, wherein the processor has a display which displays values and states.

10. Generator system as in claim 1, wherein the electronic units are hybrid thick and thin film circuits on ceramic substrates that convey heat well.

11. Generator system as in claim 1, wherein the electronic units include RF-generating and amplifying circuit components, all of which are push-pull.

12. Generator system as in claim 1, wherein each electronic unit includes a rapid response current and temperature surveillance circuit, a controlled ENABLE-DISABLE unit, and a diagnostics unit.

13. Generator system as in claim 12, wherein the temperature-surveillance circuit employs a semiconductor, as a temperature sensor.

14. A generator system as in claim 13, wherein the semiconductor is a bipolar transistor.

15. Generator system as in claim 14, wherein the amplifier means includes an amplifier with a power output that can be programmed up to 1000 W.

16. Generator system as in claim 14, wherein the amplifier means comprises two parallel push-pull MOS broad-band high-power amplifier modules that are activated in the push-pull mode.

17. Generator system as in claim 12, wherein the current surveillance circuit has at least two semiconductors, with different-size emitter surfaces and a test resistor with a direct power current flowing through it.

18. Generator system as in claim 12, wherein surge signals at the output terminal of at least one of the oscillator and the amplifying means modules are added to DISABLE-signal inputs of an adjacent one of the modules.

19. Generator system as in claim 18, wherein the current-surveillance circuit in the amplifying means is disengaged during external modulation.

20. Generator system as in claim 12, wherein each diagnostics unit outputs a diagnostics signal and the processor logically adds the diagnostics output signals to external control signals to control the electronic units.

21. Generator system as in claim 12, wherein the output of the temperature surveillance circuit is logically added to a DISABLE-signal input to the ENABLE-DISABLE unit.

22. Generator system as in claim 1, wherein the amplifier means comprises a power amplifier supplied by an external DC-supply voltage with a variable level.

23. Generator system as in claim 1, wherein the output filter is a low-pass filter of a high order and high output in minimal space.

24. Generator system as in claim 23, further including coils with gap-free magnetic cores and power-chip capacitors mounted flat in an enclosure that conducts heat well, whereby the cores are in extensive contact with the enclosure.

25. Generator system as in claim 23, wherein the low pass filter is a Chebishev filter of the fifth order and has at its output terminal the second or third harmonic attenuated more than 50 db as compared to the base frequency of the oscillator.

26. Generator system as in claim 1, wherein the directional coupler is a high-power four-pole directional coupler with an orientation of at least 40 db and taking up a minimum of space.

27. Generator system as in claim 26, wherein the directional coupler module includes a shallow parallelepipedal metal enclosure, two slightly separated parallel cylindrical conductors mounted on sheet-metal intakes positioned at a right angle to them and extending by way of insulators through two of the enclosure's walls, one wall of the enclosure being movable.

28. Generator system as in claim 27, wherein a set-screw on the enclosure engages an edge of the movable wall as symmetrically as possible.

29. Generator system as in claim 1, further including a trigger stage comprising a reverse-power comparator, one input terminal of which communicates with a reverse-power test output terminal of the directional coupler and the output terminal of which communicates with a DISABLE-input terminal of the oscillator such that, when a prescribed triggering threshold is exceeded, the oscillator will discontinue operation.

30. Generator system as in claim 1, further including a forward-power regulator in the form of a voltage comparison circuit, one input terminal of which communicates with a forward-power testing output terminal of the directional coupler and the output terminal of which communicates with a control input terminal of a regulable external direct-current source such that the level of the current operating voltage is controlled and the RF power at an output terminal of the generator is regulable.

31. Generator system as in claim 1 further including choke coils and transformers mounted on the tile.

32. Generator system as in claim 31, further including a cooling system.

33. An RF power-generator system, comprising:
a shielded housing;
a plurality of electronic units in the form of modules disposed in the housing, the electronic units including an oscillator and amplifier means coupled to the oscillator;
a plurality of other modules disposed in the housing, the other modules including amplifier means, an output filter, coupled to the amplifier means, a directional coupler coupled to the output filter, and a processor for controlling the electronic units, the oscillator being a crystal-controlled oscillator having a quartz crystal with a push-pull MOS amplifier with positive feedback to excite the quartz crystal and with a programmable power output of from 1 to 10 w.

34. Generator system as in claim 33, wherein the push-pull MOS amplifier means includes MOS transistors coupled as voltage-controlled current sources and a two port circuit with a distributed network employed as a feedback component.

35. Generator system as in claim 33, having an output terminal, wherein a bandpass filter that also acts as a balun transformer is connected to the output terminal.

36. Generator system as in claim 33, wherein the output voltage is switchable between sinusoidal and quasi-rectangular.

37. An RF power-generator system, comprising:
a shielded housing;
a plurality of electronic units in the form of modules disposed in the housing, the units including an oscillator and push-pull MOS broad-band amplifier means coupled to the oscillator; and
a plurality of other units disposed in the housing, the other units including an output filter coupled to the amplifier means, a directional coupler coupled to the output filter and a processor for controlling the electronic units.

38. Generator system as in claim 37, further including an RF-input circuit comprising a distributed LC network.

39. Generator system as in claim 38, wherein the input circuit, includes two semiconductor diodes that are made conductive by a DISABLE signal to short circuit an RF input signal.

40. Generator system as in claim 37, wherein the amplifier means includes an intermediate amplifier with a programmable power output of 10 to 30 W.

41. Generator system as in claim 40, further including a modulation input terminal for an external rectangular modulation signal.

42. Generator system as in claim 41, wherein the modulation signal is coupled to a ENABLE/DISABLE signal.

* * * * *